United States Patent [19]
Mori

[11] Patent Number: 5,354,206
[45] Date of Patent: Oct. 11, 1994

[54] SPRING BALANCED SOCKET

[75] Inventor: Ikuo Mori, Oizumi, Japan

[73] Assignee: Texas Instruments Incorporated, Dallas, Tex.

[21] Appl. No.: 131,066

[22] Filed: Oct. 4, 1993

[30] Foreign Application Priority Data

Oct. 5, 1992 [JP] Japan .................................. 4-290752

[51] Int. Cl.⁵ ........................................... H01R 23/72
[52] U.S. Cl. ..................................... 439/68; 439/266; 439/526
[58] Field of Search .................................... 439/68–73, 439/525, 526, 266

[56] References Cited
U.S. PATENT DOCUMENTS 5,154,619 10/1992 Matsuoka .............................. 439/68

Primary Examiner—Neil Abrams
Attorney, Agent, or Firm—Russell E. Baumann; Richard L. Donaldson; René E. Grossman

[57] ABSTRACT

A socket 10 for mounting an electrical part 40 in a carrier member 44 having a plurality of terminal leads 42 extending only from one side is provided with a base socket member 12 having a center axis. A plurality of electrical contact members 14 with a predetermined spring force are mounted in the base socket member 12 positioned on one side of the center axis of the base aligned to make contact with the plurality of terminal leads 42. Additionally, a plurality of spring members 30 with a preselected spring force equal to the total spring force of the plurality of contact members 14 are mounted in the base adapted to engage the carrier member on the opposite side of the center line of the socket base member 12 to balance the spring force of the plurality of contact member 14 so that the electrical part 40 will maintain proper positioning in the socket 10 for reliable electrical contact with the electrical contacts 14.

13 Claims, 7 Drawing Sheets

SPRING BALANCED SOCKET

BACKGROUND OF THE INVENTION

The invention relates to a socket for mounting electrical parts such as IC packages in a freely detachable fashion to obtain an electrical connection with the electrical parts.

In the manufacture of semiconductor circuit chips (IC chips), it is generally the case that an IC package prepared by resin-sealing IC chips are subjected to reliability tests called "burn-in" as well as electric property tests prior to their shipment for the purpose of separating the good products from the defective products. In the electric property test, the input/output properties of the IC chips, pulse characteristics, and noise leeway, etc., are tested. In the "burn-in", those IC packages which have passed the electric property test are placed in an oven and made to function for a certain length of time at an elevated temperature as, for instance, 120 degrees centigrade and at a voltage level which is approximately 20 percent greater than the rated value. The IC packages that have not passed the "burn-in" are rejected as dissatisfactory products, with only those IC packages which have functioned normally being shipped out as satisfactory products.

In recent years, the IC packages of the vertical surface mount package (VPAK) type or of the surface mounting type, with leads being provided only on one side of the package, have become increasingly popular. The IC package of this type typically is mounted with the one side where the lead is provided on a printed substrate so that the package as a whole is installed in a vertical state. The use of these packages has the advantage of increasing the substrate mounting density.

A typical prior art structure of a socket for the conventional testing of an IC package of such a VPAK type is shown in FIGS. 16 and 17. FIG. 16 shows the state prior to the IC package being mounted on the socket and FIG. 17 shows the state in which the IC package has been mounted.

In these figures, the IC package 100 is of the VPAK type, with one row of leads 102 protruding on one side of the package. Since the IC package of this type tends to have the leads 102 easily bent by an external force, a carrier 104 is used when the package 100 is inserted in the socket. In carrier 104, IC package 100 is carried by a claw part 104b at the bottom of a movable piece 104a which is provided on the inner surfaces that face each other in the longitudinal direction of the carrier 104 and shown in FIG. 16. The bent tip part of the leads 102 is received by a protuberant part 104c which is provided on the carrier 104.

Socket 106 has a base 108 as the main socket body. At a prescribed location in base 108 at a location which corresponds to leads 102 of the IC package 100 that is to be mounted on the socket, a plurality of contacts 110 are provided in a row.

Each contact 110 is typically prepared by extruding a thin sheet of beryllium copper, or the like, and has a base edge 110a which is buried in the base 108, an arc spring part 110b which extends upward in a curved fashion from the top of this base edge 110a, a linear spring part 110c which extends like a straight line upward from the top of this arc spring part 110b and a contact part 110d which is formed at the tip of the linear spring part 110c. A socket terminal pin 110e sticks out vertically downward from the bottom of the base edge 110a.

An upper surface of the base 108 extends out in an upward direction from the center of the base parallel with the linear spring part 110c of the contact 110, thereby constituting the an included wall part 112. Contact part 110d of contact 110 is directly adjacent a flat surface at the top of this wall part 112. On the inner side of the wall part 112, there is provided a partition wall 114 for the purpose of preventing any contact between the neighboring contacts 110. Guides 120 are erected at the four corners of the upper surface of the base 108 for the purpose of guiding the carrier 104 on insertion and removal from the socket.

At the time when an IC package 100 is to be mounted on the socket 106, the carrier 104 is inserted to contact the upper surface of the base 108 being positioned by guides 120. The IC package 100 and the carrier 104 are compressed from above with reference to the base 108 by using a tool (which is not shown in the drawings) as diagrammatically shown by an arrow F in FIG. 17.

With such a design with the use of the carrier member, there has been bent leads and alignment problems. When the IC package 100 is mounted on the upper surface of the base 108, the lead 102 is elastically estopped by the contact 110 only on one side of the IC package 100 as is shown in FIG. 17, with a consequence that the IC package 100 is typically slanted at an angle. In such a slanted state, the lead 102 receives a large stress between the contact 110 and the protuberant part 104c which can result in the lead being bent or the IC package 100 escaping from the claw part 104b thereby not being fixed in carrier 104.

SUMMARY OF THE INVENTION

Accordingly, it is an object of this invention to provide, a highly reliable socket for mounting and obtaining electrical connection with an electrical part which possess a plurality of connective terminals that protrude from one side of the package.

According to this invention a socket for mounting in a freely detachable manner an electrical part having a side with a plurality of terminal leads extending only from said side of said part comprises a base socket member having a center line, a plurality of contact elements spring mounted in said base socket member positioned on one side of said center line of the base socket member adapted to make electrical contact with said plurality of terminal leads with each contact member making contact with a respective terminal lead, said plurality of contact members having a preselected total spring force and spring means mounted on said base adapted to engage said electrical part on said opposite side of said center line so as to generally balance the spring force of said plurality of contact members.

When the prescribed electrical parts are inserted into the main socket body and a prescribed compressive force is added between the electrical parts and the main socket body, each contact element carries out compressive contact with each connective terminal of the electrical part by such elastic force as its own bending, etc. The electrical parts receive a spring pressure in conformity with the number of the contact elements and the pattern of their arrangement.

Meanwhile, the electrical parts receive a spring pressure which balances with the spring pressure coming from all of the contact elements by means of a spring means. Thus, the electrical parts are mounted in a state of equilibrium and form a stable electric connection with the main or base socket body.

BRIEF DESCRIPTION OF THE DRAWINGS

Other objects, advantages and details of this invention appear in the following detailed description of the preferred embodiments of the invention, the detailed description referring to the drawings in which.

DESCRIPTION OF PREFERRED EMBODIMENTS

The embodiments of this invention will be explained below by referring to FIGS. 1 through 15.

Figure 1:
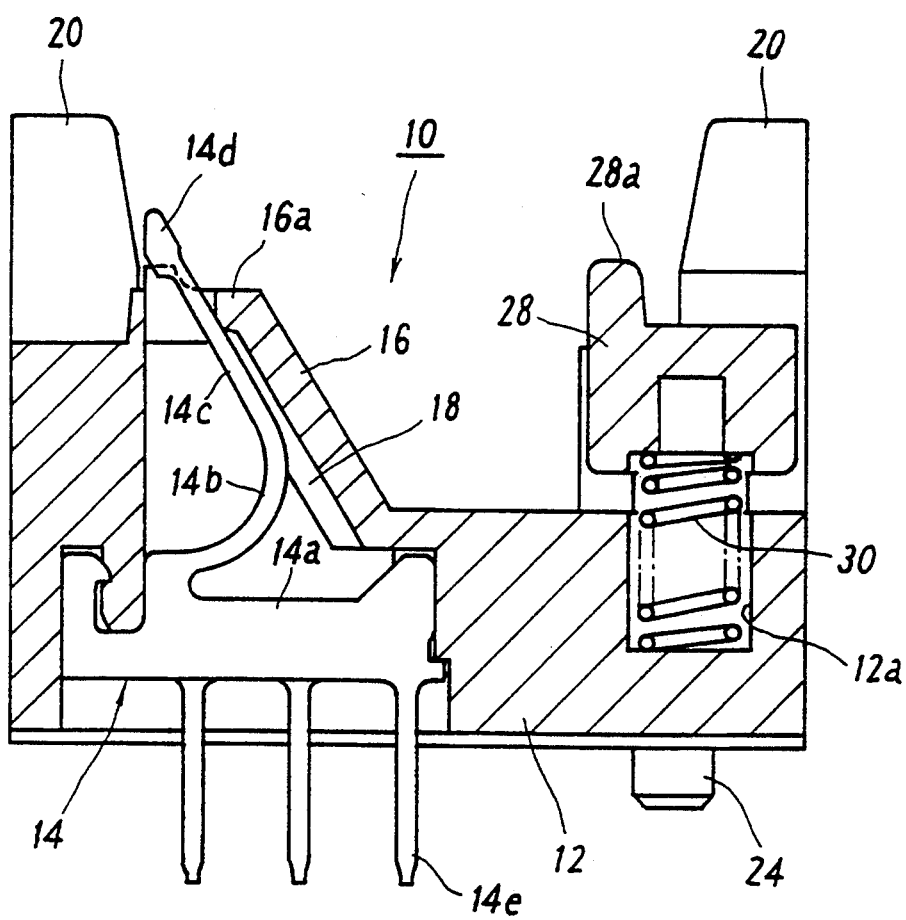
FIG. 1 is an enlarged cross-sectional side view of the construction of a socket of this invention.
Figure 2:
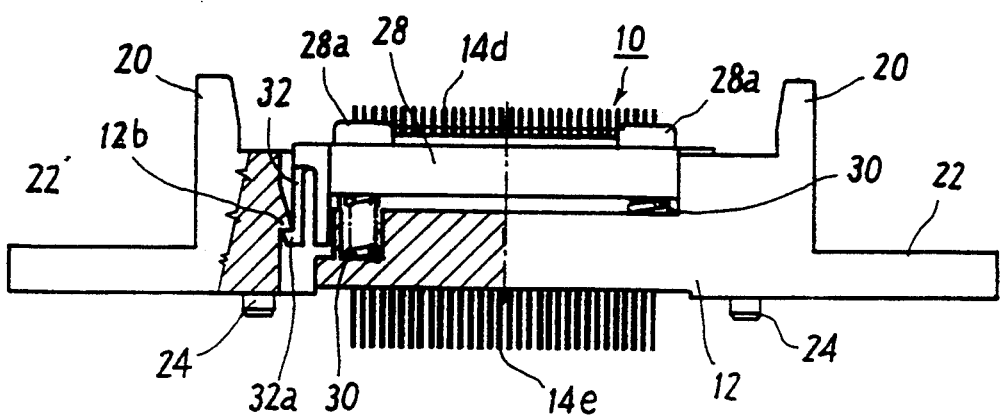
FIG. 2 is a partial cross-sectional front view of the socket of FIG. 1.
Figure 3:
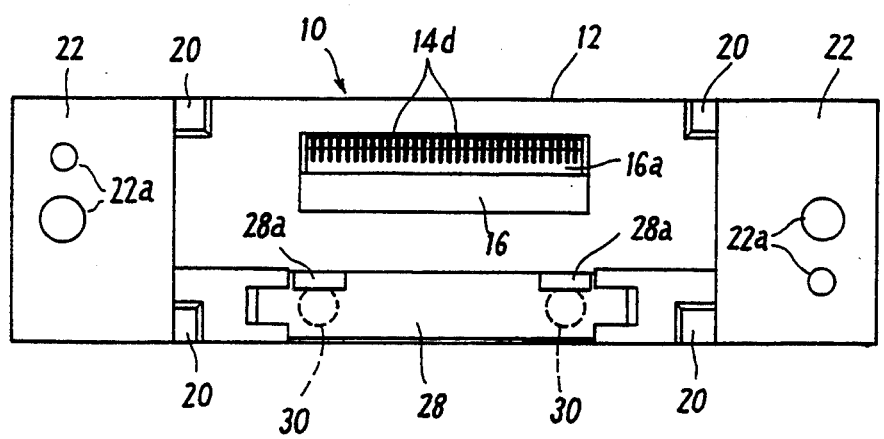
FIG. 3 is a plane view of the socket of FIG. 1.
Figure 4:
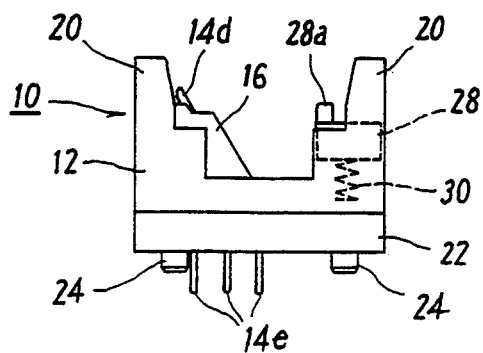
FIG. 4 is a side view of the socket of FIG. 1.
Figure 5:
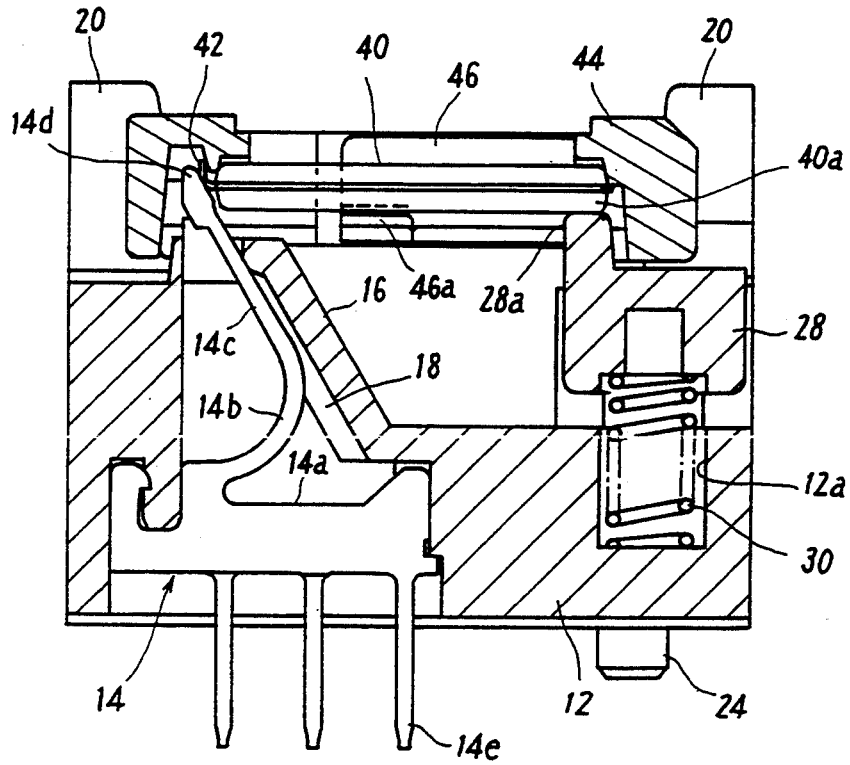
FIG. 5 is an enlarged cross-sectional view of the socket of FIG. 1 where an IC package and carrier has been attached in the socket.
Figure 6:
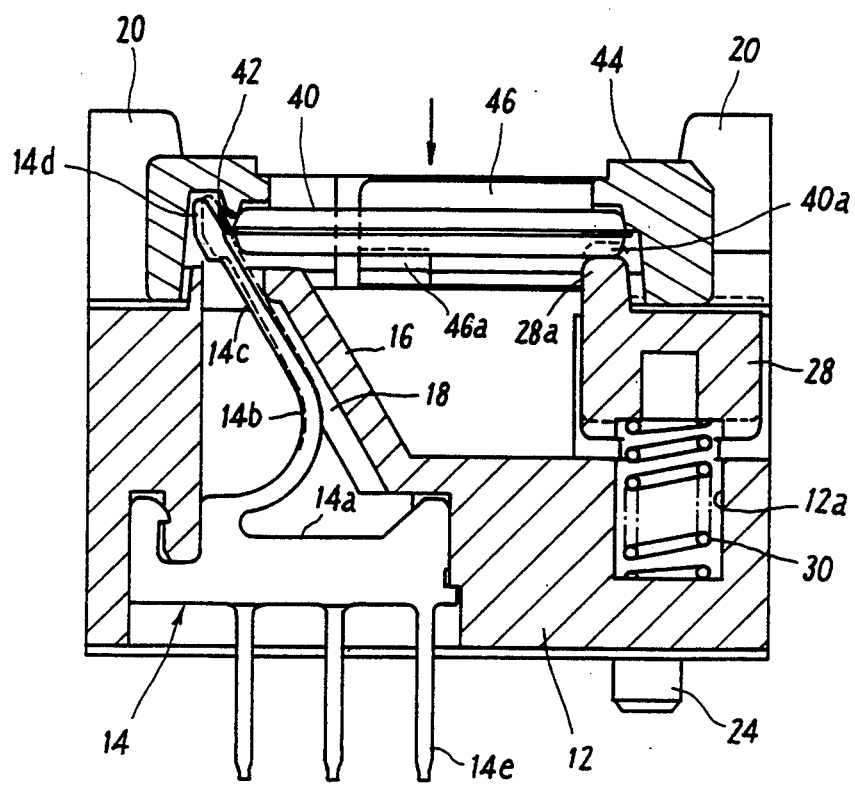
FIG. 6 is an enlarged cross-sectional view of the socket of FIG. 1 when an IC package and carrier has been mounted.

FIGS. 1 through 6 show the construction of a first embodiment of a socket of the present invention which can be suitably used for performance testing of an IC package of the VPAK type. FIG. 1 is a cross-sectional side view, FIG. 2 is a partial cross-sectional front view, FIG. 3 is a plane figure, FIG. 4 is a side view, FIG. 5 is a cross-sectional view showing the state at the time when the IC package is attached or detached, and FIG. 6 is a cross-section showing the state at the time when the IC package is mounted.

Figure 7:
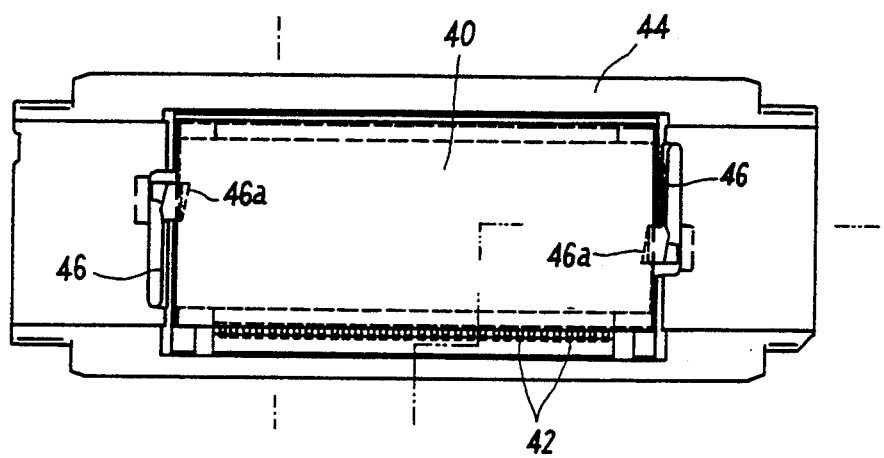
FIG. 7 is a plane view of an IC package of a carrier to be mounted in the socket of this invention.
Figure 8:
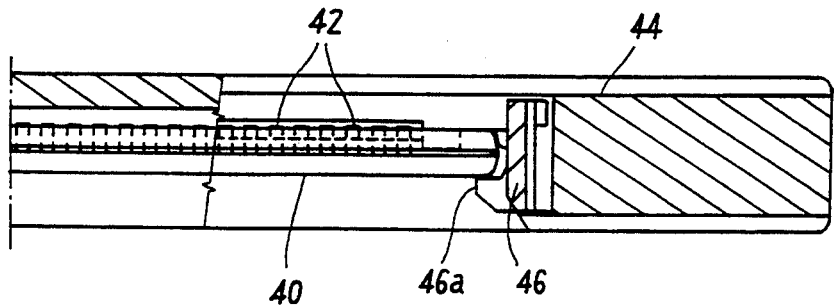
FIG. 8 is a cross-sectional view cut along line 8—8 of FIG. 7.
Figure 9:
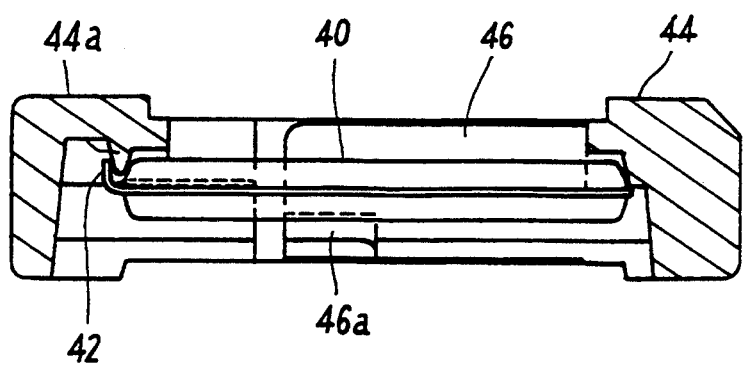
FIG. 9 is a cross-sectional view cut along line 9—9 of FIG. 7.

In addition, FIGS. 7 through 9 show the IC package of the VPAK type and the carrier that holds this IC package. FIG. 7 is a plane figure, FIG. 8 is a cross-section cut along line 8—8 in FIG. 7, and FIG. 9 is a cross-section cut along line 9—9 in FIG. 7.

As is shown in FIGS. 7 through 9, an IC package 40 of the VPAK type has a row of leads 42 protruding from one side of the package; and it is mounted on the socket in this embodiment while being held on a carrier 44. Inside the carrier 44, the IC package 40 is carried and held in position by a claw part 46b at the bottom of a movable piece 46 that has been provided on both inner sides that face each other in the longitudinal direction of the carrier 44, and the bent tip of the lead 42 is received by a protrusion 44a that is provided inside the carrier 44.

Figure 16:
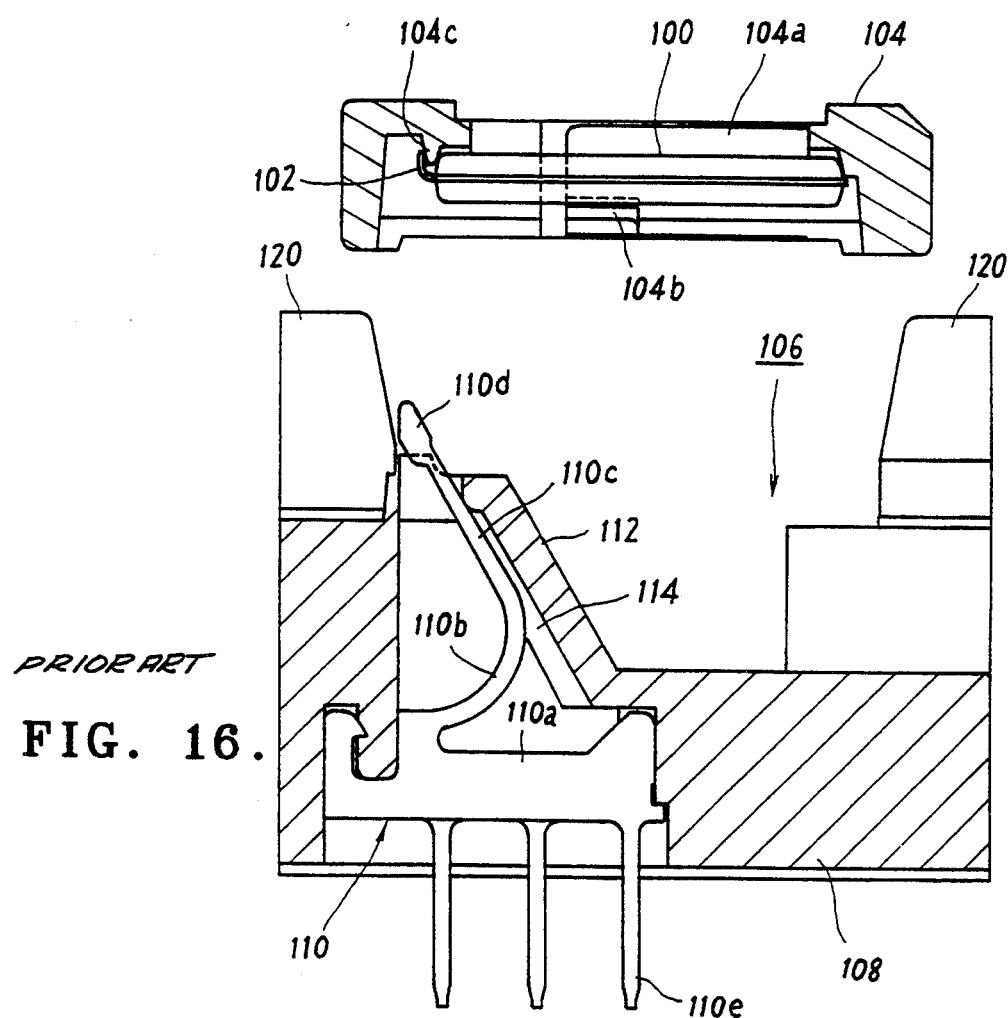
FIG. 16 is an enlarged cross-sectional view of a prior art socket prior to mounting of an IC package and carrier on the socket.
Figure 17:
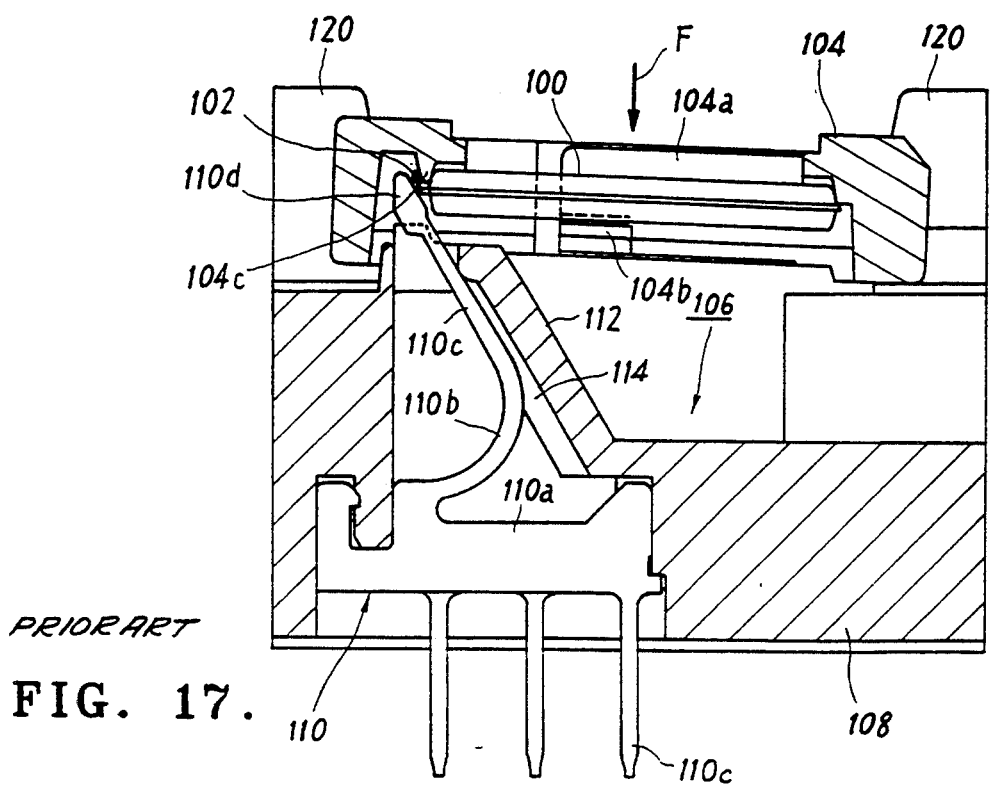
FIG. 17 is an enlarged cross-sectional view of the socket of FIG. 16 at the time of the mounting of an IC package and carrier on the socket.

The constructions of the IC package 40 and carrier 44 are the same as the construction of the IC package 100 and carrier 104 that are mounted on the socket 106 according to prior art (FIGS. 16 and 17). It is mentioned in this connection that FIG. 8 is a cross-section shown for the main purpose of indicating the construction of the carrier 44. The construction of the IC package in the Figure does not accurately correspond to line 8—8 in FIG. 7.

In FIGS. 1 through 4, the socket 10 has a base 12 as a main socket body which is to be fixed on a printed base board (which is not shown in the drawings). At a prescribed location in this base 12 or at a location corresponding to the lead 42 of the IC package 40, a plurality (corresponding to the number of the leads) of contacts 14 are arranged in a row. The contact 14 may be prepared by extruding a thin sheet of resilient electrically conductive material such as beryllium copper or the like. Each contact 14 has a base edge part 14a which is buried in the base 12, an arc spring part 14b which extends upward with a curved shape from the top of base edge part 14a, a linear spring part 14c which extends upward to the outside in a straight line from the top of arc spring 14b, and a contact 14d which is formed at the tip of the linear spring part 14c.

From the bottom of the base edge part 14a, a socket terminal pin 14e sticks out vertically below it. A wall part 16 of base 12 having an inclined surface is constructed in parallel with the linear spring part 14c of the contact 14, with the upper surface of the wall part 16 extending or rising upward to the outside. The contact part 14d of the contact 14 protrudes from a flat surface 16a at the top of the wall part 16.

On the inner side of the wall part 16, a partition wall 18 is provided for the purpose of preventing mutual contact between the neighboring contacts 14. At each of the four corners on the upper surface of the base 12, a guide 20 is provided for the purpose of guiding/controlling the carrier when inserted into the socket. For the purpose of installing the main socket body 12 on a printed base board (which is not shown in the drawings), a flange 22 is provided longitudinally extending from base 12 (see FIGS. 2 and 3) with installation hole 22a which work with a protrusion 24 integrally formed vertically downward from the lower surface of the base 12.

As is shown in FIGS. 1 and 3, the contacts 14 are arranged inside the socket 10 at positions which are positioned at one side from the center of the socket. On the upper surface of the base 12, the contact parts 14d of the contact 14 correspondingly are arranged in a row at locations positioned at one side from the central line in the longitudinal direction of the socket 10. Such an installation arrangement of the contacts 14 corresponds to the arrangement pattern of the leads 42 in the IC package 40 to be mounted on the main socket body 10.

In the socket 10, a stopper member 28 which extends approximately in parallel with the contact row is arranged at a location on the side which is opposite to the contacts 14 as viewed from the central line along the longitudinal direction on the upper surface of the base 12. A receiving part 28a of a protuberant shape is provided at both ends of the upper surface as shown in FIG. 1 of this stopper member 28. This stopper 28 is supported by a plurality (typically 2) of compressing coil springs 30 which are arranged on the base 12 and said springs are capable of movement in the vertical direction.

In the base 12, there is provided a blind holes 12a which hold the compressive coil springs 30 at a location which is immediately below the stopper member 28. Each compressive coil spring 30 is accommodated in the blind hole 12a in such a way that a top portion of the spring protrudes above blind hole 12a in the uncompressed state thereby carrying the stopper member 28. The spring pressure of these compressive coil springs 30 is selected so that the spring pressure of all coil springs 30 is in balance with the spring pressure of all contacts 14. That is, spring value for all coil springs is equal to the spring value for all of the contacts.

As generally shown in FIG. 2, a latch member 32 is installed on both sides of the stopper member 28. A hook part 32a is provided at the bottom of this latch member 32. As this hook part 32a is engaged with a concave part 12b on the base wall that opposes same, the stopper member 28 is caused not to be able to disengage upward from the base 12 due to biasing force of coil springs 30.

Below, the actions of the various parts at the time when the IC package 40 is mounted on the main socket body will be explained by referring to FIGS. 5 and 6.

As is shown in FIG. 5, first, the carrier 44 which holds the IC package 40 is made to face a certain prescribed direction; that is, the direction in which the lead 42 of the IC package 40 faces the contact 14 of the socket 10 and is inserted into the upper surface of the base 12 along the guides 20.

Thus, each lead 42 is placed in contact with a corresponding contact 14 in a 1:1 relationship on one side of the IC package 40. The lower surface of the side of package 40 opposite to the side having leads 42 has side end portion 40a of the package which is placed on the receiving part 28a of the stopper member 28. Since the total pressure of the contacts 14 and the total pressure of the compressive coil springs 30 that support the stopper member 28 are in balance with each other, the load of the IC package 40 will approximately evenly apply to the contact side and the stopper member side, with a consequence that the IC package 40 and the carrier 44 maintain a horizontal position when in the socket.

As is shown in FIG. 6, the IC package 40 and the carrier 44 are compressed by a suitable tool (which is not shown in the drawings) in the vertical direction under a prescribed pressure (see arrow). Because of this pressure from above, the curved spring 14b and the linear spring 14c of the contact 14 slightly rotate in a counterclockwise direction and the contact part 14d changes its position away from the center of the socket. The lead 42 changes its position somewhat in a downward vertical direction as shown by solid line in FIG. 6. At the position where the load upon the IC package 40 equals the total elastic force (reaction) of all of the contacts 14, the contact between the lead 42 and the contact 14d is set with a result that a satisfactory electric contact is obtained between the two.

At the same time on the opposite side of the IC package 40, the side end 40a of the IC package 40 and the stopper member 28 change their positions by the aforementioned compressive force by a prescribed distance downward in the vertical direction in opposition to compressive coil springs 30 to a point where the elastic force (reaction) based on the compressive aforementioned deformation of the compressive coil springs 30 balances with the load of the IC package 40 and the external compressive force.

Since the total spring pressure of the contacts 14 and the total spring pressure of the compressive coil springs 30 are in balance with each other, the amount of the displacement on the contact 14 side of the IC package 40 and the amount of the displacement on the stopper member 28 side are approximately equal to each other and thus, even after a downward displacement, the IC package 40 will be maintained in a horizontal relationship to the base of the socket.

Accordingly, the IC package 40 is subjected to a prescribed electrical property test in the state of being installed horizontally with socket. After the completion of the test and the lifting of the compressive force, the IC package and carrier return to the state shown in FIG. 5 so that it becomes possible to pick out IC package 40 and carrier 44 from the socket 10.

As has been described earlier in the socket 10, the contacts 14 are arranged in a row at locations which are positioned to one side from the center line along the longitudinal direction of the socket with the stopper member 28 supported by the compressive coil springs 30 being situated on the side opposite the center line to the row of the contacts 14 and the total spring pressure of the coil springs 30 balances with the total spring pressure of the contacts 14. As a result, the IC package 40 of the VPAK type is maintained approximately in a horizontal state upon being mounted on the socket, with a satisfactory electric contact being obtained under suitable pressure between the lead 42 of the IC package 40 and the contact 14.

Accordingly, there will be no danger for the IC package 40 to tilt in the socket 10 nor will there be any possibility for the lead 42 to bend or for the IC package 40 to jump out of the carrier 44.

Figure 10:
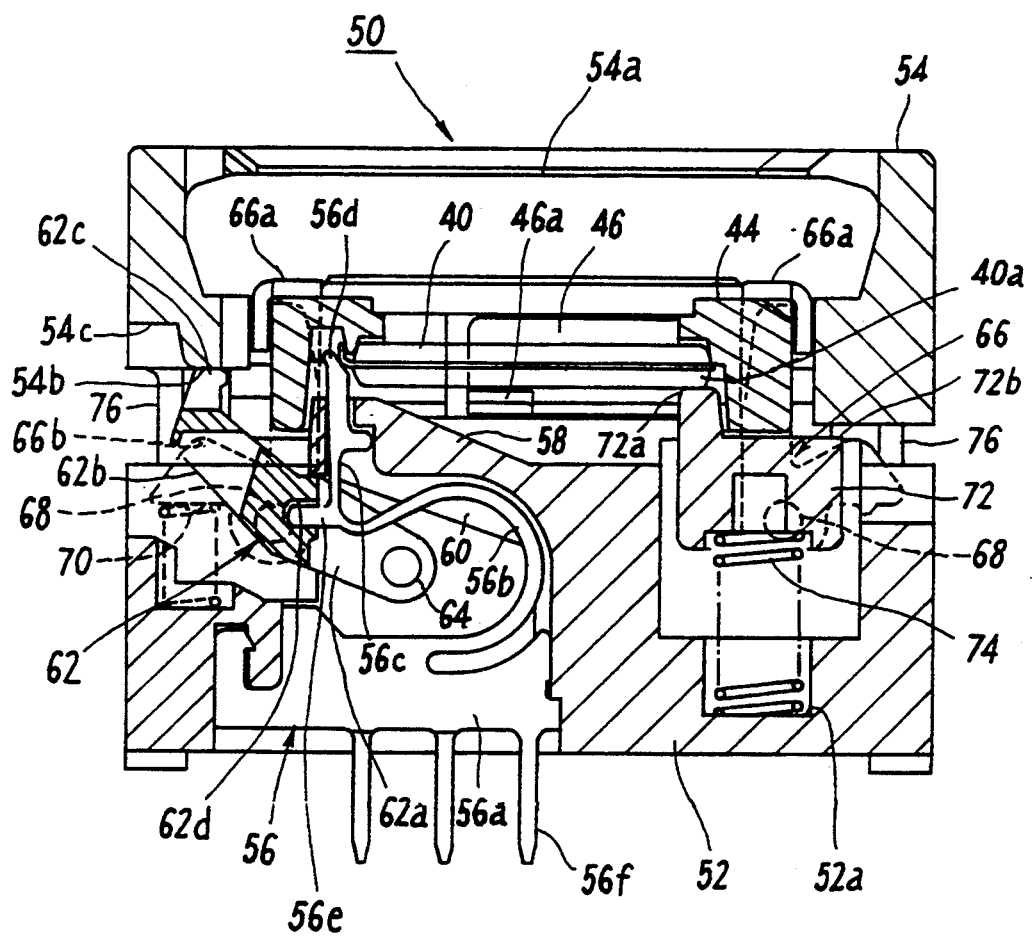
FIG. 10 is an enlarged cross-sectional side view of the construction of a second embodiment of a socket of this invention when an IC package and carrier have been attached in the socket.
Figure 11:
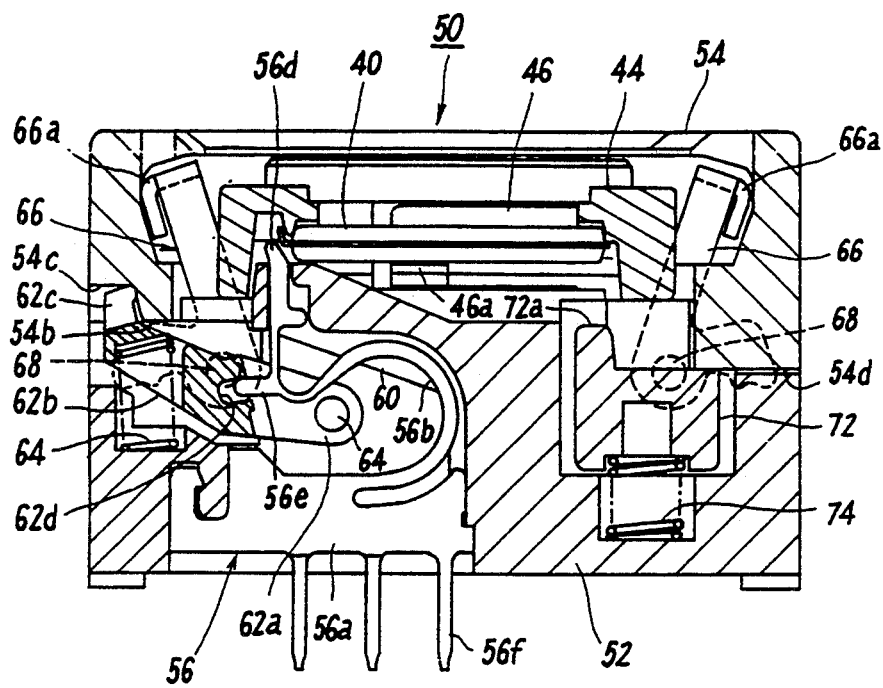
FIG. 11 is an enlarged cross-sectional view of the socket of FIG. 10 when an IC package and carrier have been mounted.
Figure 12:
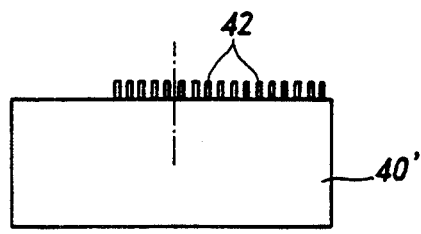
FIG. 12 is a plane view showing an alternative lead arrangement pattern of an IC package.

FIGS. 10 and 11 show a second embodiment of the socket of this invention, which is suitable for use in an IC package of the VPAK type; that is, FIG. 10 is a cross-section indicating the state in which the IC package is mounted in the socket; that is, the state in which the contact is closed. FIG. 11 is a cross-section indicating the state in which the IC package is either being attached or detached; that is, the state in which the contact is open.

Since the burn-in is carried out for several hours to several days, while the electrical property test on the IC chips in the IC package is completed in a matter of several seconds, the socket for the burn-in typically has a mechanism which locks the electrical connection state with the IC package.

In FIGS. 10 and 11, the socket 50 in this example comprises a base 52 as a main socket body that is fixed on the printed base board (which is not shown in the drawing) and a cover 54 which is mounted in a reciprocating manner against this base 52. The cover 54 has an opening for inserting the IC package 40 and carrier 44 into the main socket and for taking them out of it.

The upper surface of the base 52 is so constructed as to enable the mounting of an IC package of the VPAK type. The contacts 56 are arranged in a row on one side as viewed from the center line of the longitudinal direction of the base 52. The contacts typically are made from an electrically conductive resilient material such as beryllium copper or the like. Each contact has a base edge part 56a which is buried in the base 52, an arc spring part 56b which extends upward in a curved fashion from the top of this base edge 56a, a linear spring part 56c which extends vertically upward from the end of this arc spring part 56b, a contact part 56d formed at the tip of the linear spring part 56c and a protuberant part 56e which extends outward approximately horizontally from the end of the arc spring part 56b. A socket terminal pin 56f sticks vertically downward out of the bottom of the base edge part 56a.

The upper surface of the base 52 extends or rises externally upward from the center so as to cover the curved spring part 56b of the contact 56, thereby constituting the wall 58 with an inclined surface, and the contact part 56d of the contact 56 sticks out of the flat surface of the upper end of the wall 58. On the inner side of the wall part 58, there is provided a partition wall 60 for the purpose of preventing the neighboring contacts 56 from contacting each other.

A cam 62 is provided on the external side of the contact 56 in the base 52. This cam 62 has a lever part 62a that is installed freely rotatably on an axis 64 which is provided on the inner walls that face each other in the longitudinal direction of the base 52, a contact part 62b that extends in parallel with the row of the contacts 56, and an upper edge part 62c as a subordinate knot that is freely movable between a concave portion 54c provided on the side of the cover 54 and a lower surface portion 54b of the cover 54. On the inner side of the contact driving part 62b, there is provided a concave portion 62d which is positioned to receive the protuberant part 56e of each contact 56.

In the base 52, further, a pair of L-shaped latches 66 (with short arm and long arm parts) for maintaining the mounted state of the IC package 40 and carrier 44 are provided on both sides of the central opening for the mounting of the IC package. The bend part of the latch 66 is rotatably installed on a shaft 68 which is provided on the inner walls which face each other in the longitudinal direction of the base 52 and, at the edge of the long-arm part of the latch 66, a carrier holding part 66a extending in the longitudinal direction of the base is provided. Between the short arm part of the latch 66 and the bottom of the base 52, moreover, a compressive coil spring 70 as shown in FIG. 10 is provided.

In FIG. 10, it is to be noted that the compressive coil spring 70 against the latch 66 on the right-hand side of the figure is not shown in order to facilitate the understanding of the figure.

At a location which is opposite to the row of the contacts 56, as viewed from the center line in the longitudinal direction of the base 12, there is arranged a stopper member 72 extending approximately in parallel with the contact row. At both ends of the upper surface of this stopper member 72, a protuberant receiving part 72a is provided. This stopper member 72 is supported by a plurality (such as a couple) of compressive coil springs 74 which are arranged on the base 52 so as to effect a displacement in the vertical direction.

In the base 52, blind holes 52a that holds the compressive coil springs 74 is created in the vertical direction at a location immediately below the stopper member 72. The total spring pressure of the plurality of compressive coil springs 74 is preselected to accurately balance with the total spring pressure of the contacts 56.

Between the base 52 and the cover 54, moreover, there is provided a latch-equipped guide bar 76 for guiding the up and down movement of the cover 54.

Below, the actions of the various parts of the socket of the second embodiment will be explained when an IC package is mounted.

As the cover 54 is moved toward the base 52 from the position generally indicated in FIG. 10 (without the IC package being present), the lower end surface 54b of the cover 54 pushes down the upper edge 62c of the cam 62. Thereupon, the cam 62 rotates in the counter-clockwise direction with the axis 64 as the center. Because of this rotation, the upper edge part of the cam 62c moves outwardly along the lower end surface 54b of the cover 54 until it enters the concave 54c. At the same time, concave 62d of contact driving part 62b pushes down protuberant part 56e of contact 56.

As protuberant part 56e comes down, the curved spring part 56b and the linear spring part 56c of the contact 56 are displaced toward outside of the socket with a result that the contact part 56d moves outwardly in a counterclockwise direction from the contact position. The lower end surface 54b of the cover 54 touches the upper end part 66b of the short-arm part of the latch 66, thereby pressing it down, when the upper end 62c of the cam escapes to the outer side (concave 54c).

Because of this action, the latch 66 is rotated outwardly with the axis 62 as the center (the latch 66 on the right side in the clockwise direction and the latch 66 on the left side in the counterclockwise direction), with a result that the carrier holding part 66a of latch 66 opens outward.

On the side of the socket of the stopper member 72, meanwhile, the lower surface 54d of the cover 54 pushes down the upper surface 72b of the stopper member 72. Because of this downward force, the stopper member 72 moves vertically downward against compressive coil springs 74.

That is, as the cover 54 is pushed down toward the base 52 in this manner, the contact part 56d of the contact 56 and the carrier holding part 66a of the latch 66 move in a direction away from the longitudinal center line of the socket and at the same time, the stopper member 72 moves downward toward the base.

In such a state, the carrier 44 that holds the IC package 40 is inserted into the main socket body through the opening 54a of the cover 54. At this juncture, the carrier 44 and IC package 40 are positioned on the base 52 by means of a positioning means (which is not shown in the drawing). FIG. 11 shows the state in which the IC package 40 and the carrier 44 have been charged into the main socket.

Then, the force pushing down the cover 54 is release whereby the cover 54 is raised through the latch 66 due to the restoring force of the compressive coil spring 70 on the side of contact 56, with a result that the latch 66 rotates inwardly and that the carrier holding part 66a covers both of the upper edges of the carrier 44.

Along with the elevation of the cover 54, the cam 62 rotates in a clockwise direction, with a result that its upper edge 62c shifts from the concave portion 54c of the cover 54 to the lower surface portion 54b.

In this manner, the compressive coil spring 64 exerts an upward base to the cover 54. As the cam 62 rotates in the clockwise direction, further, its contact driving part 62b uplifts the protuberant part 56e of the contact 56 by engagement with concave recess 62d. Thereupon, the curved spring 56b and linear spring 56c of the contact 56 are restored to their original positions and the tip contact part 56d contacts the lead 42 of the IC package 40 with a compressive force corresponding to the elasticity of the curved spring 56b and the linear spring 56c.

On the side of the stopper member 72 (side opposite to contact 56), when the push down of the cover 54 is released, the lower surface 54d of the cover 54 is raised by the upper surface 72b of the stopper member 72 due to the restoring force of the compressive coil spring 74, with a consequence that the cover 54 rises. In addition, the receiving part 72a of the stopper member 72 contacts the lower surface of the side edge part 40a of the IC package 40.

Due to the various action movements described above, the carrier 44 is held from above by the carrier holding part 66a of the latch 66 as is shown in FIG. 10. Further, contacts 56 and receiving part 72a from the opposite side support the carrier with approximately balanced spring pressure from both sides of the socket thereby providing a horizontal stabilized electrical connected state.

In this position, the IC package 40 receives a burn-in test comparatively for a long period of time.

When the IC package 40 and carrier 44 are to be taken out of the main socket body 50, it is only necessary to push down the cover 54 toward the base 52 in which the state shown in FIG. 11 is restored, thereby making it possible to pick out the carrier 44 and the IC package 40.

In the socket for the burn-in test according to this second embodiment, stopper member 72 which is supported by the compressive coil spring 74 is positioned on the side which is opposite to the contact 56 and as the total spring pressure of the compressive coil springs 74 works on the IC package 40 in equilibrium with the total spring pressure of the contacts 56, the IC package 40 is mounted approximately in a horizontal state, with a result that a satisfactory compressive contact force is obtained between the lead 42 of the IC package 40 and the contact part 56d of the contact 56.

Accordingly, there will be no danger of the IC package 40 being tilted inside the socket 50 nor is there any possibility for the lead 42 to bend or for the IC package 40 to jump out of the carrier 44.

Suitable embodiments of this invention have been explained in detail above. However, this invention is not to be limited to these embodiments but can be varied or amended within the range of its technical concept.

Figure 13:
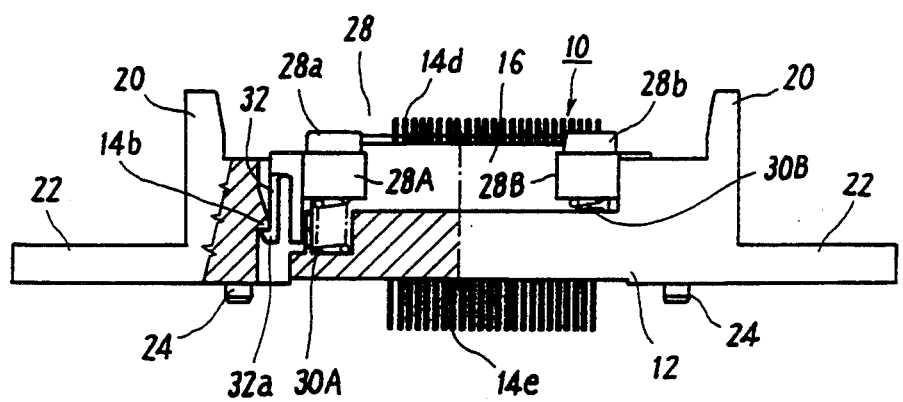
FIG. 13 is a partial cross-sectional front view of a socket for use with the IC package of FIG. 12.
Figure 14:
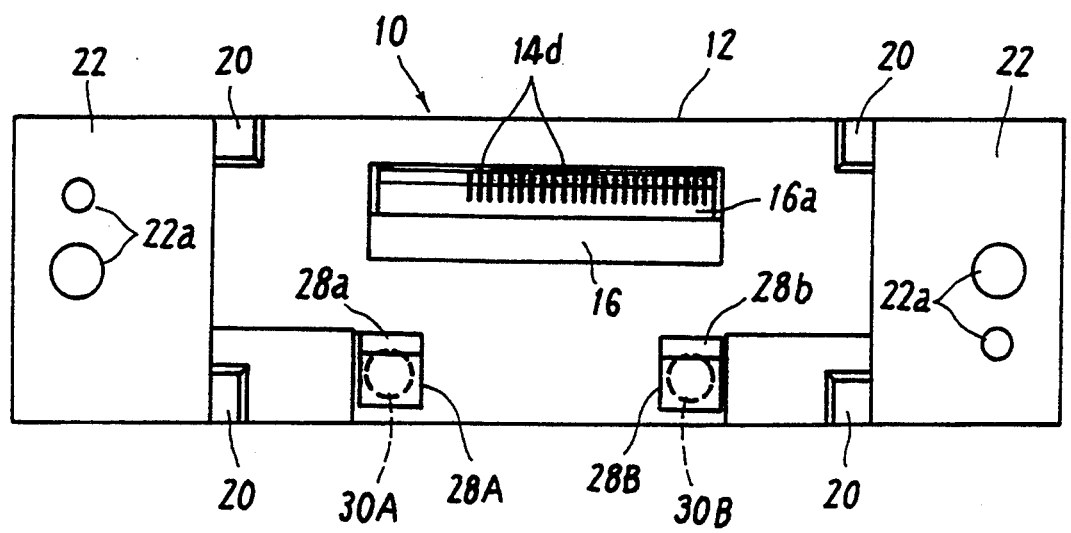
FIG. 14 is a plane figure of the socket of FIG. 13.

For example, the socket for the electric property test in the aforementioned first embodiment can be modified to have such a construction as is shown in FIGS. 13 and 14 for use with an IC package 40' of the VPAK type (see FIG. 12) in which leads 42 are in a non-symmetrical configuration as compared with the central line G.

In this modified example, stopper members 28A and 28B are installed with compressive coil springs 30A and 30B and the spring pressure of the various compressive coil springs 30A and 30B can be adjusted separately depending the lead configuration/positioned. Because of this, the spring pressure balance is maintained between the stopper members 28A and 28B and the total spring pressure of the socket contacts with a result that the IC package 40' can be mounted approximately horizontally in the socket 10, thereby obtaining a stable electrical contact. A similar modification is possible for the socket 50 for the burn-in test as shown in the aforementioned second example.

Figure 15:
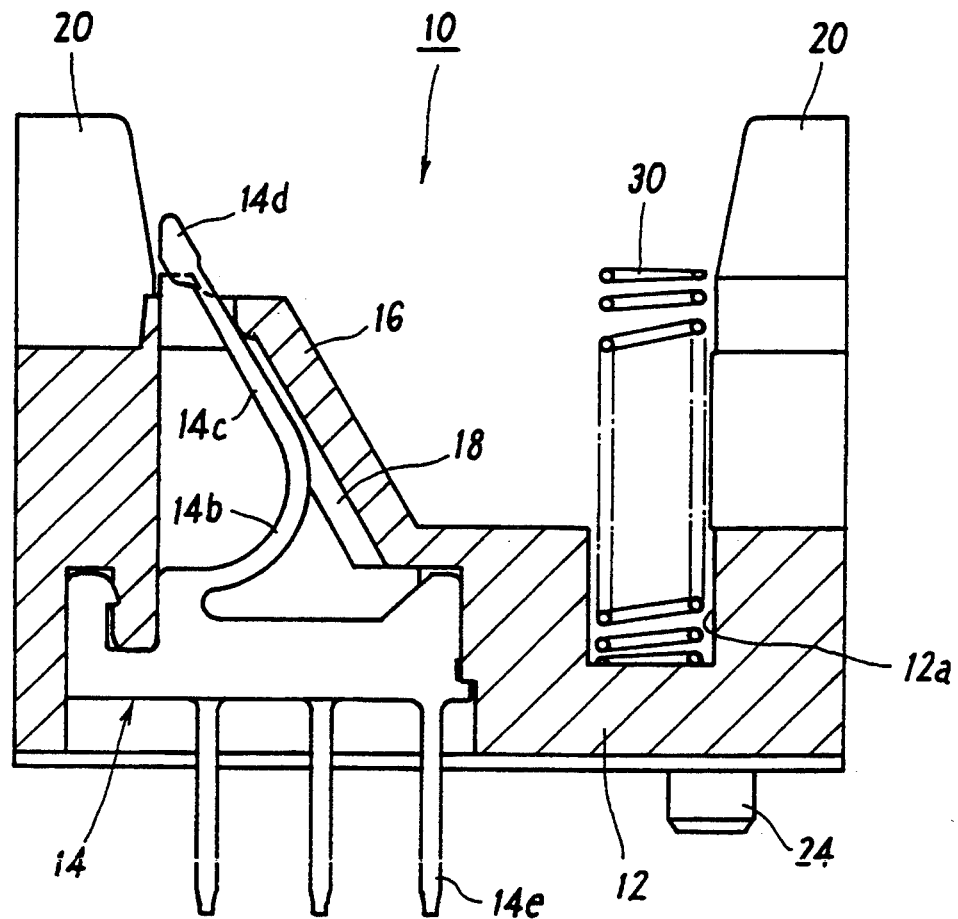
FIG. 15 is an enlarged cross-sectional view of a socket of still another embodiment of the present invention.

As is shown in FIG. 15, a further variation is to make the compressive coil spring 30 directly receive the IC package 40 (which is not shown in the drawing) in the socket for the electrical property test shown in the aforementioned embodiment. Also, similar modification is possible in the case of the socket 50 for the burn-in test as described in the aforementioned second embodiment.

Additionally, the spring means in this invention is not limited to the compressive coil spring. It may be constructed by sheet springs, etc., to cite an example. The positions for the installation and arrangement of the spring means can also be freely selected.

The socket of this invention is not limited to the IC package of the VPAK type but it may be used in any IC package in which the leads (connective terminal) extend in an unbalanced or non-symmetrical pattern from the package. Furthermore, the socket can be used for the electrical parts other than the IC package.

As has been explained above, it is possible with the socket of this invention to mount electrical parts in a right posture and in a state of equilibrium to obtain a stable electric connection by providing a spring means for elastically receiving the electric parts in parallel with a plurality of socket contact elements which are connected electrically in an elastically compressive state with a plurality of connective terminals of the prescribed electric parts.

This invention has been described above with reference to the aforementioned embodiments. It is evident, however, that many alternatives, modifications and variations will be apparent to those skilled in the art in light of the foregoing description. Accordingly, it is intended to embrace all such alternatives, modifications and variations as fall within the spirit and scope of the appended claims.

I claim:

1. A socket for mounting in a freely detachable manner an electrical part having a plurality of sides with terminal leads provided only on one side of the part, the socket comprising a base member having a center line, a plurality of contact members spring mounted in said base member positioned on one side of said center line of said base member adapted to make electrical contact with said plurality of terminal leads with each contact member making contact with a respective terminal lead, said plurality of contact members having a preselected total spring force and spring means having no electrical function of a preselected spring force equal to the spring force of the plurality of contact members mounted on said base adapted to support said electrical part on the opposite side of said center line so as to generally balance the spring force of said plurality of contact members to ensure reliable electrical contact is made.

2. The socket according to claim 1 wherein said electrical part is an IC package which is housed in a carrier member for mounting in said socket.

3. The socket according to claim 1 said spring means comprises a stopper means, a portion of which supports said electrical part and a plurality of spring members mounted in said base compressively engaging said stopper member.

4. The socket according to claim 3 wherein said plurality of spring members are two coil springs and said stopper member extends generally parallel to said plurality of contact members with the coil springs positioned to biasly engage the stopper members adjacent each end of the stopper member.

5. The socket according to claim 1 further including a cover member reciprocally mounted on said base and a cam means movable in response to the reciprocal movement of said cover member to cause said plurality of contacts to correspondingly move into and out of engagement with said plurality of terminal leads upon socket mounting and dismounting.

6. The socket according to claim 1 wherein said plurality of terminal leads extending from only one side of said electrical part are in a non-symmetrical configuration.

7. The socket according to claim 6 wherein said spring means comprises a stopper means, a portion of which supports said electrical part extending generally parallel to said plurality of terminal leads and a plurality of coil springs of preselected spring strength positioned to biasly engage said stopper means to balance the spring force of the non-symmetrical terminal leads of the electrical part upon mounting of the electrical part.

8. The socket according to claim 7 wherein said plurality of coil springs have different spring force.

9. A socket for mounting in a freely detachable manner an IC package in a carrier in which the IC package has a plurality of sides with terminal leads provided on only one side of the part, the socket comprising a base member having a center line, a plurality of contact members spring mounted in said base member positioned on one side of said center line of said base member adapted to make electrical contact with said plurality of terminal leads with each contact member making contact with a respective terminal lead, said plurality of contact members having a preselected total spring force and spring means having no electrical function of a preselected spring force equal to the spring force of the plurality of contact members and comprising a stopper means generally parallel in alignment to said plurality of contact members which is biasly engaged by a plurality of spring members, said spring means mounted on said base adapted to support said IC package in said carrier on the opposite side of said center line from said plurality of contact members so as to generally balance the spring force of said plurality of contact members so that the IC part will maintain proper positioning in the socket for reliable electrical contact with the plurality of contact members.

10. The socket according to claim 9 further including a cover member reciprocally mounted on said base and a cam means movable in response to the reciprocal movement of said cover member to cause said plurality of contacts to correspondingly move into and out of engagement with said plurality of terminal leads upon socket mounting and dismounting.

11. The socket according to claim 9 wherein said plurality of terminal leads extending from only one side of said electrical part are in a non-symmetrical configuration.

12. A socket for mounting in a freely detachable manner an electrical part having four sides with a plurality of terminal leads extending from at least one side of said part in a totally non-symmetric configuration with relation to a center line of the socket, the socket comprising a base member having said center line, a plurality of contact members spring mounted in said base member positioned non-symmetric in said base member adapted to make electrical contact with said plurality of terminal leads with each contact member making contact with a respective terminal lead, said plurality of contact members having a preselected total spring force and spring means having no electrical function of a preselected spring force equal to the spring force of the plurality of contact members mounted on said base adapted to support said electrical part on the opposite side of said center line from said plurality of contact members so as to generally balance the spring force of said plurality of contact members to ensure reliable electrical contact is made.

13. The socket according to claim 1 further including a latching means for holding the electrical part in a mounted state.

* * * * *